United States Patent
Shinoura

(10) Patent No.: US 6,574,853 B2
(45) Date of Patent: Jun. 10, 2003

(54) TORQUE SENSOR AND MANUFACTURING METHOD OF THE SAME

(75) Inventor: Osamu Shinoura, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/940,433

(22) Filed: Aug. 29, 2001

(65) Prior Publication Data

US 2002/0078765 A1 Jun. 27, 2002

(30) Foreign Application Priority Data

Dec. 22, 2000 (JP) .................................... 2000-391463
Jul. 4, 2001 (JP) .................................... 2001-203944

(51) Int. Cl.⁷ .............................................. H01F 7/06
(52) U.S. Cl. ..................................... 29/602.1; 29/609.1
(58) Field of Search ........................... 29/602.1, 621.1, 29/604, 607, 609.1

(56) References Cited

U.S. PATENT DOCUMENTS 5,491,369 A * 2/1996 Ishino et al. ................. 310/26
5,585,574 A * 12/1996 Sugihara et al. ........ 73/862.333
6,073,831 A * 6/2000 Lee et al. ................... 228/208

FOREIGN PATENT DOCUMENTS

| JP | 59-166828 | | 9/1984 | |
| JP | 59-181576 | | 10/1984 | |
| JP | 62006129 A | * | 1/1987 | .............. G01L/3/10 |
| JP | 62-184323 | | 8/1987 | |
| JP | 63-16238 | | 1/1988 | |
| JP | 05026747 A | * | 2/1993 | .............. G01L/3/10 |
| JP | 6-63876 | | 8/1994 | |
| JP | 6-291384 | | 10/1994 | |
| JP | 10-185713 | | 7/1998 | |
| JP | 2002082000 A | * | 3/2002 | .............. G01L/1/12 |

* cited by examiner

Primary Examiner—Hezron Williams
Assistant Examiner—Lilybett Martir
(74) Attorney, Agent, or Firm—Oblon, Spivak, McCleland, Maier & Neustadt, P.C.

(57) ABSTRACT

There is disclosed a torque sensor comprising: a shaft whose torque is to be detected; a magnetostrictive film formed on the shaft; and a coil for detecting a change of a magnetic property of the magnetostrictive film, wherein an intermediate film having a melting point lower than a melting point of the shaft and a melting point of magnetostrictive film is formed between the shaft and the magnetostrictive film, so that the torque sensor is superior in productivity and durability and can detect a torque in a rotational direction.

8 Claims, 6 Drawing Sheets

TORQUE SENSOR AND MANUFACTURING METHOD OF THE SAME

BACKGROUND OF THE INVENTION

1. Field of the Invention

The present invention relates to a torque sensor for utilizing a magnetostrictive effect anisotropy to detect a torque by a magnetic property change of a magnetostrictive film generated corresponding to the torque applied to a shaft, and a manufacturing method of the torque sensor.

Particularly, as an electromotive power steering apparatus for a car, the apparatus is constituted such that a rotation output of an electric motor as an auxiliary steering torque is reduced by a gear apparatus, and transmitted to an output shaft of a steering mechanism, a steering force applied to a steering wheel is assisted, and a wheel is steered. In the apparatus, a torque sensor for detecting the steering force transmitted to an input shaft, that is, the torque can preferably be used. The electric motor is driven in accordance with a detected result of the torque sensor, and a stable car driving can be realized by generating an auxiliary steering force.

2. Description of Related Art

In a magnetostrictive torque sensor, a magnetostrictive film such as an Ni—Fe alloy film (foil) is formed on the surface of a shaft formed of a stainless steel or another nonmagnetic material, or SCM material or another magnetic material, and a torque is detected from a magnetic property change of the magnetostrictive film by a stress. In an operation principle of the sensor, a magnetostrictive effect anisotropy (magnetic elasticity effect anisotropy), that is, a phenomenon in which magnetic properties such as permeability or loss change by a magnetic anisotropy change caused by applying the torque to the magnetostrictive film is utilized. In further detail, the magnetic anisotropy change is converted to an inductance change, reactance change accompanying the inductance change, impedance change, resistance change in impedance, and the like by a magnetic circuit disposed outside, and the torque is detected by measuring the above change parameter.

For example, when a tensile stress is applied to the magnetostrictive film having a positive magnetostrictive constant, the permeability increases. Conversely, when a compression stress is applied to the film, the permeability decreases. When a permeability change of the magnetostrictive film by the stress is measured as an electric signal, the torque applied to the shaft can be detected.

The magnetostrictive torque sensor is broadly utilized as a torque sensor for detecting a torsional torque applied to a rotation shaft.

Moreover, for example, in data MAG-81-71 (1981) of Electrical Engineers of Japan (Magnetics), and Japanese Patent Publication No. 63876/1994, a manufacturing method of a magnetostrictive torque sensor is disclosed. The method comprises: applying a predetermined torsional torque to the rotational shaft in a predetermined direction; forming the magnetostrictive foil having magnetic anisotropy on the surface of the rotational shaft by adhesion bond; and subsequently removing the torsional torque, so that adverse influences such as an offset voltage in the vicinity of zero of the torsional torque and a difference in sensitivity to the torsional torque on left and right sides in the vicinity of zero of the torsional torque are removed. However, when the sheet of magnetostrictive foil is bonded to the shaft, the magnetic properties attributed to winding start and end of a thin band become uneven, and a problem of drift of an output with rotation of the shaft occurs.

Japanese Patent Application Laid-Open Nos. 184323/1987 and 164931/1984 disclose torque sensors in which the magnetostrictive film is directly formed on the shaft by a spray coating process, and a plating process, respectively. These torque sensors solve the problem that the magnetic properties become uneven with the bonded magnetostrictive foil and the problem that the output drift attributed to the uneven magnetic properties occurs. Moreover, in the torque sensor a uniform magnetostrictive film can be formed with respect to the shaft rotation, and a detecting coil is disposed/inclined to an axial direction so that the torque is detected. However, such a complicated detecting coil is required, and additionally the anisotropy preferable for detecting the shaft torque cannot be imparted in an oblique direction of 45 degrees. Moreover, in a journal of the Magnetics Society of Japan, vol. 22, p. 1074, another torque sensor is disclosed in which an NiFe sputtered film is formed on the shaft. Since the film is formed by a sputtering process, it is unnecessary to bond a magnetostrictive film prepared in another step to the shaft. Moreover, since the film is formed on the shaft being rotated, uniformity in a shaft circumferential direction is enhanced. However, it is also described that there are many restrictions on selection of the magnetostrictive material because of a relation between an inner stress and magnetostrictive constant during formation (deposition), and that a pattern shape is restricted.

Japanese Patent Application Laid-Open No. 185713/1998 discloses a strain sensor in which a current is passed through a strain raising material and a heat treatment is performed in a furnace. This solves a problem that anisotropy is incompletely imparted to the magnetostrictive film directly formed on the shaft by a plating process. In this method, an inductive magnetic anisotropy is applied in a right-angle direction to a shaft longitudinal direction, and the anisotropy preferable for detecting the shaft torque of an inclined 45 degree direction cannot be imparted.

In the aforementioned magnetostrictive torque sensor, the property is enhanced by a step of forming or bonding the magnetostrictive film onto the shaft with the torsional torque applied thereto and imparting the magnetic anisotropy in a manufacturing process.

However, when the magnetostrictive foil is bonded to the shaft with the torque applied thereto, a dispersion of a detecting property is disadvantageously generated. Particularly, in a method of forming only the magnetostrictive foil by a high-speed quenching process, and the like, and attaching the foil to the shaft, the bonding step is further added to the magnetostrictive foil forming step. Furthermore, when the foil is attached to the shaft, a stress is generated in the foil. Since the flat magnetostrictive foil sheet is attached along a circumference of the shaft, an attached portion is made in at least one portion of a circumference. Since the property of this portion is largely different from that of another portions, a dispersion is generated in a torque output value.

Moreover, when the magnetostrictive film is formed on the shaft with the torque applied thereto, a film forming chamber apparatus is generally small. Therefore, when the torque is applied to the shaft during the formation of the magnetostrictive film, a large restriction is imposed onto the apparatus. A production quantity per unit time decreases, and a cost increase results. Moreover, the magnetostrictive film is formed even on a jig for applying the torque, a countermeasure for preventing this problem is necessary, and an economical loss caused by formation of an expensive magnetostrictive film onto an unnecessary portion cannot be ignored. Furthermore, it is remarkably difficult to fix a middle portion of the shaft, and apply the torsional torque to the shaft in a complicated manner in which opposite ends of the shaft are twisted in the same direction during formation of the film.

As described above, various advantages are obtained when the magnetostrictive film is formed by the plating process, spray coating process, sputtering process or evaporation process. However, there is a large disadvantage that there is no process for applying a bias torque suitable for mass production.

SUMMARY OF THE INVENTION

The present invention has been developed to solve the aforementioned related-art problem, and an object thereof is to provide a magnetostrictive torque sensor and a manufacturing method of the sensor which can solve problems such as an insufficient productivity accompanying a restriction on the apparatus in a step of forming a magnetostrictive film to a shaft with a torque applied thereto, an economical loss caused by an unnecessarily formed film on a jig or another portion, a dispersion of a detecting property attributed to a step of bonding the magnetostrictive film to the shaft with a torque applied thereto, and a property dispersion in a shaft circumferential direction.

To attain the aforementioned object, according to the present invention, there is provided a torque sensor having: a shaft whose torque is to be detected; a magnetostrictive film formed on the shaft; and a coil for detecting a change of a magnetic property of the magnetostrictive film, wherein an intermediate film having a melting point lower than a melting point of the shaft and lower than a melting point of the magnetostrictive film is formed between the shaft and the magnetostrictive film.

Moreover, according to the present invention, there provided a torque sensor having a magnetostrictive film formed on a shaft whose torque is to be detected, wherein an intermediate film having a melting point lower than a melting point of the shaft and lower than a melting point of the magnetostrictive film is formed in a portion between the shaft and the magnetostrictive film.

Furthermore, in a preferred mode for carrying out the present invention, the intermediate film is formed of any metal selected from the group consisting of Sn, Pb, Bi, In, and Cd, or an alloy containing the metal selected from the group consisting of Sn, Pb, Bi, In, and Cd as a main component.

Additionally, in another preferred mode of the present invention, the intermediate film is formed by a plating process, spray coating process, sputtering process, or evaporation process.

Moreover, in further preferred mode of the present invention, the magnetostrictive film is formed by the plating process, spray coating process, sputtering process, or evaporation process.

Furthermore, in still further preferred mode of the present invention, the magnetostrictive film is constituted in a state in which a torque as a bias is applied to the torque to be detected.

Additionally, according to the present invention, there is provided a manufacturing method of a torque sensor having a magnetostrictive film formed on a shaft whose torque is to be detected, comprising the steps of: forming an intermediate film having a melting point lower than a melting point of said shaft, forming said magnetostrictive film having a melting point higher than the melting point of said intermediate film; subjecting said shaft with the torque applied thereto to a heat treatment at a temperature which is not higher than the melting point of said shaft, not higher than the melting point of said magnetostrictive film and not lower than the melting point of said intermediate film; and removing said torque after the temperature drops.

Moreover, according to the present invention, there is provided a manufacturing method of a torque sensor having a magnetostrictive film formed on a shaft whose torque is to be detected, comprising the steps of: forming an intermediate film having a melting point lower than a melting point of said shaft in a portion, forming said magnetostrictive film having a melting point higher than the melting point of said intermediate film; subjecting said shaft with the torque applied thereto to a heat treatment at a temperature which is not higher than the melting point of said shaft, not higher than the melting point of said magnetostrictive film and not lower than the melting point of said intermediate film; and removing said torque after the temperature drops.

According to the present invention, there can be a magnetostrictive torque sensor superior in uniformity of a shaft in a circumferential direction, and a manufacturing method of the sensor, which is simple, superior in productivity, and little in manufacturing dispersion. Moreover, a defective product produced in a manufacturing process is corrected, and a loss can be reduced.

DETAILED DESCRIPTION OF THE PREFERRED EMBODIMENTS

A preferred embodiment of the present invention will be described hereinafter with reference to the drawings. Minimum constituting elements of a torque sensor of the present invention include a shaft whose torque is to be detected, a magnetostrictive film formed on a surface of the shaft, an intermediate film formed in at least one portion between the shaft and the magnetostrictive film, and a coil for detecting a magnetic property change of the magnetostrictive film.

Figure 1A:
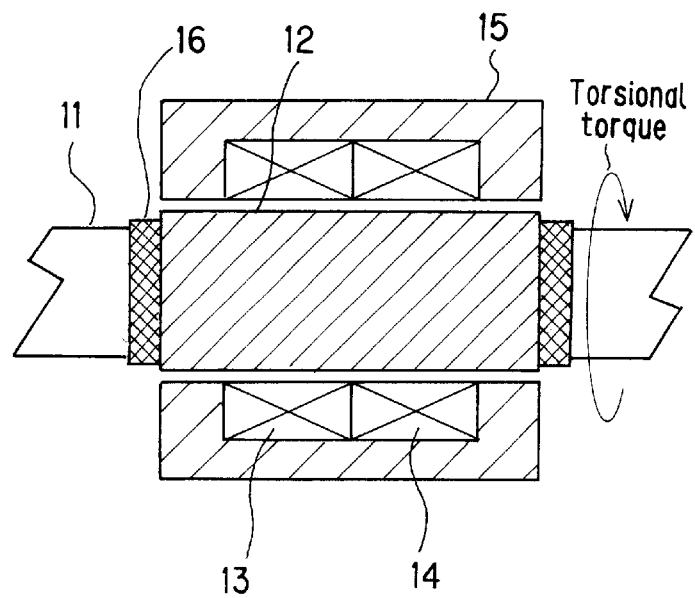
FIGS. 1A and 1B are sectional views showing a structure of a torque sensor of the present invention.
Figure 1B:
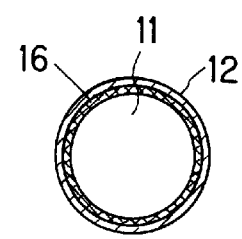

FIGS. 1A and 1B are sectional views of the magnetostrictive torque sensor according to one embodiment of the present invention. The magnetostrictive torque sensor is comprised of a rotational shaft 11, a magnetostrictive film 12 formed on a surface of the shaft, an intermediate film 16, an exciting coil 13 disposed at an interval from the rotational shaft 11 and magnetostrictive film 12, a pickup coil 14 for detecting the magnetic property change of the magnetostrictive film, and a cylindrical yoke 15 formed of a soft magnetic material.

A principle of torque detection will be described. An alternating current is applied to the exciting coil 13, and the magnetostrictive film 12 is excited. At this time, an inductive output is generated in the pickup coil 14. When the torque is applied to the magnetostrictive film 12, a stress is generated, permeability is changed by a magnetostrictive effect, and the inductive output generated in the pickup coil 14 accordingly changes. Therefore, the torque can be detected by measuring the inductive output.

In the present invention, the magnetostrictive film having the magnetostrictive effect is preferably formed on the surface of the shaft by a plating process, spray-coating process, sputtering process or evaporation process. Since the film is formed by these process, a step of bonding the magnetostrictive foil to the shaft by an adhesive or the like is eliminated, and additionally the magnetostrictive film can continuously and uniformly be formed in a shaft circumferential direction. However, different from the step of bonding the magnetostrictive foil to the shaft by the adhesive, it is difficult to release a stress applied to the magnetostrictive film during formation, and it is also difficult to apply a bias torque essential for the torque sensor. To solve the problem, according to the present invention, the intermediate film 16 is formed between the shaft 11 and the magnetostrictive film 12 as shown in the sectional view of FIG. 1B. The intermediate film 16 is preferably formed by the plating process, spray-coating process, sputtering process or evaporation process similarly as the magnetostrictive film 12. Moreover, a material of the intermediate film 16 is selected from materials, which have a melting point less than that of the shaft 11 and magnetostrictive film 12. Since the melting point of the magnetostrictive film 12 and shaft 11 is generally 800° C. or more, the melting point of the intermediate film 16 may be less than 800° C. or preferably be 400° C. or less. A difference of the melting point between the shaft 11 or the magnetostrictive film 12 and the intermediate film 16 is 100° C. or more, preferably 200° C. or more. Concretely, any metal of Sn, Pb, Bi, In, and Cd, or an alloy containing the metal described above as a main component is particularly preferable. The melting point of Sn is 232° C., and that of Pb is 327° C., and that of SnPb is 182° C., and that of Bi is 271° C., and that of Cd is 321° C., and that of In is 156° C. Moreover, a thickness of the intermediate film 16 is in a range of 0.1 to 500 $\mu$m, preferably 0.5 to 50 $\mu$m, more preferably 0.5 to 20 $\mu$m. When the thickness is less than the range, it is difficult to apply a sufficient bias torque. When the thickness exceeds the range, the torque is not sufficiently transmitted to the magnetostrictive film 12. In either case, detection sensitivity is lowered.

Even if an alloy which contains one metal selected from the aforementioned metals as the main component, and further contains one or more metals selected from the aforementioned metals as a sub component, high-melting metals such as Ag, Cu, Zn, Ni as a sub component, or non-metals such as P, C, S by 10 wt % or less as a sub component, there is no problem when the melting point of the alloy is less than the aforementioned temperature.

Particularly, when Sn is used as the intermediate film 16, whiskers as whisker-shaped protrusions are possibly generated, or the film is possibly deteriorated by phase change (crystal structure change). However, when the Sn metal is alloyed with another metal, the problem can be prevented. Moreover, the melting point can also be lowered as compared with a single material of Sn. For example, examples of a preferably usable known alloy composition include Sn—3.5Ag, Sn—0.75Cu, Sn—8Zn, Sn—3.5Ag—0.75Cu, Sn—5Bi—3.5Ag, and Sn—3Bi—8Zn.

Moreover, when Sn or an Sn alloy is preferable as the intermediate film 16 from a viewpoint of price and safety, and an Sn or Sn alloy plated film is formed, known various plating baths and conditions can be used. For example, a borofluoride bath, a sulfuric acid bath, an organic sulfonic acid bath, and the like can be used. Furthermore, ethylenediaminetetraacetic acid, diethylenetriamine pentaacetic acid, triethylene tetramine hexaacetic acid, or the like is added as a complex compound agent. Additionally, in order to reduce a particle size of a plated film, water-soluble high-molecular weight compounds such as styrenated phenol, dihydric phenol, monohydric phenol, ethylene oxide and propylene oxide adduct of aliphatic amine and aliphatic alcohol, and gelatin and peptone can also be added.

Additionally, a surface roughness of a portion in which the magnetostrictive film is formed is frequently influenced by a forming method and condition of the intermediate film. When an underlayer film and an intermediate film are formed by the plating process, in order to reduce the surface roughness, a known gloss plating bath can be used. On the contrary, in case of obtaining the high-adhesion property, half-gloss plating bath or non-gloss plating bath can be used.

Additionally, particularly a hardness of the intermediate film is selected to be 50% or less, preferably 30% or less of the hardness of the magnetostrictive film. With the hardness, when an overload torque is applied, the magnetostrictive film can be prevented from being collapsed or stripped. For example, NiFe having a Vickers hardness of 400 is used as the magnetostrictive film, and Sn having a Vickers hardness of 40 is used as the intermediate film. The torque sensor of the present invention is structured as described above. Therefore, after formation of the magnetostrictive film, a state in which the torque is applied to the shaft is held at a temperature not higher than the melting point of the shaft, not higher than the melting point of the magnetostrictive film, and not lower than the melting point of the intermediate film. Moreover, the temperature is lowered to the temperature not higher than the melting point of the intermediate film, and it is possible to apply the bias torque. As the temperature not higher than the melting point of the shaft and magnetostrictive film, and not lower than of the melting point of the intermediate film, the temperature is preferably higher than the melting point of the intermediate film by 10 to 200° C. When the temperature is lower than this range, the sufficient bias torque is not applied. When the temperature exceeds the range, energy is wasted.

The heat treatment is not limited to a normal heat treatment with an oven. A short-time temperature increment with a high-frequency induction heating process, laser irradiation or other heating process is possible. And quenching (high-speed temperature drop) by a refrigerant is possible. Moreover, it is unnecessary to heat the whole substrate (shaft) at the heat treatment. It is apparent that the heat treatment is necessary only to the portion of the shaft with the magnetostrictive film which bias torque to be applied. Therefore, it is easy to dispose a jig for applying the torque to opposite ends of the shaft with no magnetostrictive film formed thereon.

The magnetostrictive film for the use has a large magnetostrictive constant. Concretely, examples of a known magnetostrictive film having a positive magnetostrictive constant include a Ni—Fe (Fe=30 to 65 wt %) alloy film, Fe—Co (Co=40 to 70 wt %) alloy film, TbFe alloy film such as $TbFe_2$, DyFe alloy film such as $DyFe_2$, and the like. Examples of a known magnetostrictive film having a negative magnetostrictive constant include a Ni film, Fe film, Co film, and SmFe alloy film such as $SmFe_2$. Moreover, the magnetostrictive film may contain 1 wt % or less of C, S, H, or another non-metal element in addition to the metal element as the main composition element.

Particularly, the plating process is preferable because the film can be formed at a low temperature and a uniform film can be formed even on a curved surface. For example, a Ni—Fe alloy film formed by an electric plating process is particularly preferable considering from a magnetic property, and productivity in film formation. The Ni—Fe plated film can be formed in a known plating bath. Particularly preferably, saccharin sodium is added as a stress-relaxing agent, or a hypophosphorus acid ion or an ascorbic acid ion is added as an anti-oxidizing agent of an iron ion. It is known that carbon, sulfur, and the like are deposited in the plated film, and the magnetic property and resistance to corrosion are largely influenced. The content of these elements changes mainly by an additive of the plating bath, and is therefore preferably appropriately selected.

Moreover, the surface roughness of the portion with the magnetostrictive film formed thereon influences the magnetic properties of the magnetostrictive film. When the surface roughness is large, the magnetic properties are deteriorated, and torque detection sensitivity drops. A maximum surface roughness is generally preferable in a range of 0.001 to 0.5 $\mu$m. When the roughness is less than the range, cost increases, therefore the roughness is not suitable for mass production, additionally adhesion strength is deteriorated, and the film is easily stripped. When the roughness exceeds the range, a coercive force of the magnetostrictive film increases, and the torque detection sensitivity drops as a result. Additionally, with a streak-like roughness having a proper directional property, magnetic anisotropy is induced, and conversely the torque detection sensitivity is enhanced. This contributes to output stabilization. For example, when the maximum surface roughness is set to 5 $\mu$m in parallel with a circumferential direction of the shaft, and an average crest interval is set to about 100 $\mu$m, a magnetization ease axis is oriented in the circumferential direction.

An inner stress of the magnetostrictive film is preferably a weak tensile stress. In this case, the magnetostrictive film is easily released from the shaft during the heat treatment. A strong compression stress is of course unfavorable, but no special problem occurs even with a non-stress or a weak compression stress.

In the present invention, different from a magnetostrictive film shape of a conventional sensor, it is unnecessary to form slits in the magnetostrictive film in an inclined direction with respect to the rotation shaft. That is, the film may have a band shape. Therefore, it is possible to omit steps for forming the magnetostrictive film into a desired shape, such as a step of masking during formation of the magnetostrictive film, or a step of etching/removing an unnecessary portion after the film formation. The slit may of course be formed.

Additionally, as a pretreatment for forming the magnetostrictive film, an under layer film may be formed on the shaft or on the intermediate film in order to enhance adhesion to the shaft and prevent diffusion between the intermediate film and the magnetostrictive film. For example, an Au, Cu, or Ni film is preferably used as the under layer film. As a protective film formed on the magnetostrictive film, a Ni plated film, Sn plated film, epoxy electro-deposited film, or the like are preferable. Particularly, a plated film of an alloy having a base natural potential with respect to the magnetostrictive film is preferably formed as a sacrificial protective film.

Furthermore, if necessary, an oil liquid layer, or the like may be formed on the magnetostrictive film or the protective film. Additionally, an inorganic or organic protective film may be formed on the magnetostrictive film.

When the heat treatment is performed in order to apply the bias torque after formation of an appropriate protective film, oxidation of the magnetostrictive film does not occur particularly even in an inactive atmosphere in some cases. Moreover, in the heat treatment for applying the bias torque, it is also possible to calcine and harden the protective film. For example, a ceramic protective film formed by a sol-gel process can be calcined during the heat treatment.

Figure 2A:
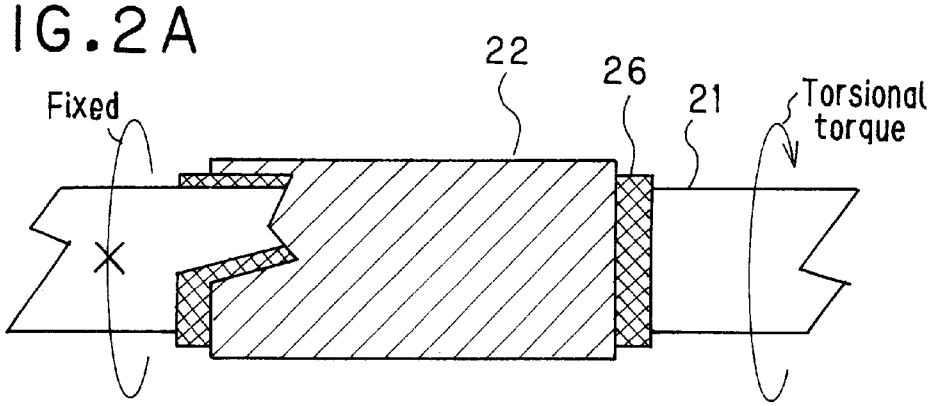
FIGS. 2A–2C show views of the structure of the torque sensor of the present invention.
Figure 2B:
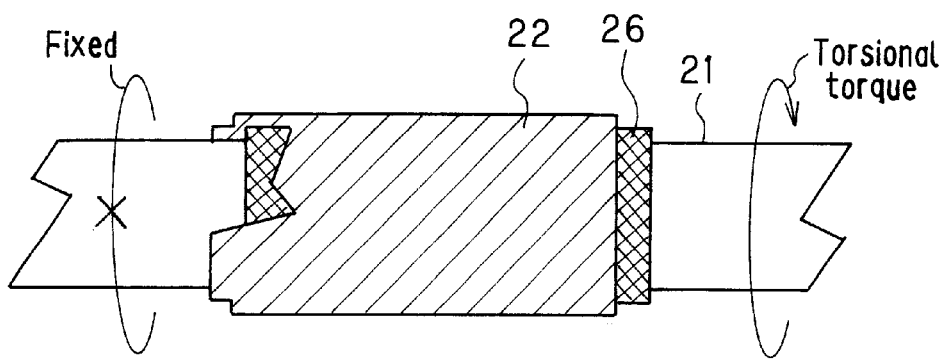
Figure 2C:
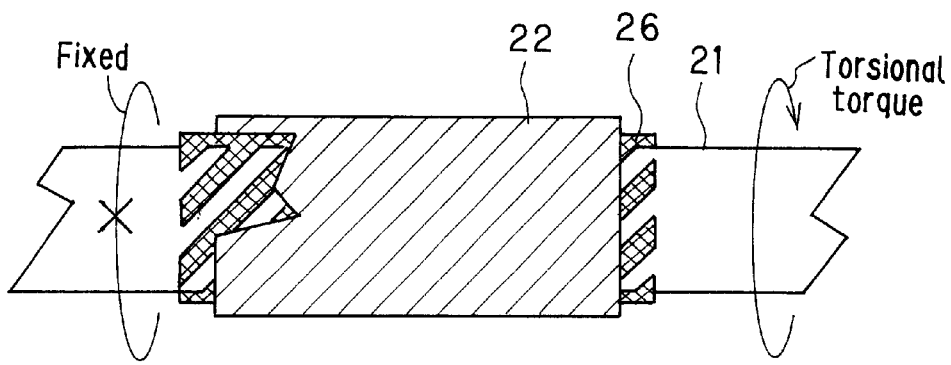

In order to apply the torque to the shaft, as shown in FIGS. 2A–2C, after an intermediate film 26 and magnetostrictive film 22 are formed on a rotational shaft 21, one end of the rotational shaft 21 is fixed, and the other end thereof with a torsional torque applied thereto may be fixed. Moreover, in the present invention, as shown in FIG. 2A, the intermediate film is entirely formed between a substrate and the magnetostrictive film, but may partially be formed. For example, as shown in FIG. 2B, the intermediate film may be formed only in one portion between the shaft and the magnetostrictive film, so that the constitution has a portion of the magnetostrictive film formed directly on the shaft. Moreover, as shown in FIG. 2C, the intermediate film may be formed in an inclined pattern with respect to the shaft. In these constitutions as shown FIGS. 2B and 2C, in a heat treatment step for applying the bias torque, strain is generated between the portion in which no intermediate film is formed and the magnetostrictive film is directly formed on the shaft and the portion in which the intermediate film is formed, and the bias torque can effectively be applied.

A heat treatment atmosphere for raising the temperature is preferably an inactive atmosphere such as a nitrogen atmosphere, or vacuum in order to prevent the magnetostrictive film from being oxidized. Moreover, in the heat treatment, hydrogen or another element contained in the magnetostrictive film is effectively released as a gas. That is, since the heat treatment is performed at a temperature higher than a use temperature during manufacturing, no gas is substantially released in a use temperature range, and the magnetic property of the magnetostrictive film can be prevented from changing. For example, according to a Thermal Desorption (TDS) method, the gas released from the film is confirmed substantially at 130° C. or more, and the magnetic property, and film property (hardness, brittleness, and the like) change with the gas release. In this case, a coarse crystal grain size in the film or another phenomenon is observed. In other words, the magnetostrictive film subjected to the heat treatment for use in the torque sensor of the present invention already releases the gas in the heat treatment step during manufacturing. Therefore, as compared with the conventional magnetostrictive film, remarkably little gas is generated at a heat treatment temperature or less, a crystal grain size changes little, and therefore the film can be distinguished. That is, when the manufactured magnetostrictive film is further heat-treated, the magnetostrictive film of the present invention has a large difference in gas generation from the conventional magnetostrictive film at the heat treatment temperature or less during manufacturing, and a large difference is not seen at the temperature higher than the heat treatment temperature during manufacturing. The torsional torque applied during the heat treatment is of the order of preferably 5 to 10000 N·m, more preferably 1 to 1000 N·m. When the torque is smaller than the range, the sufficient bias torque cannot be applied to the film and output is reduced. When the torque exceeds the range, the film is sometimes stripped from the shaft.

The torsional torque applied during the heat treatment is determined in consideration of not only a magnitude of the bias torque to be applied, but also types of the intermediate film and magnetostrictive film and film thickness, but is generally 110 to 1000% of the bias torque to be applied.

In the present invention, the bias torque is applied in a desired direction. Moreover, the isotropic stress in the film, which is unnecessary for the sensor, can be removed. Therefore, the film having a strong adhesion can be formed on the shaft, so to be able to obtain the senor without a problem of the stripped magnetostrictive film.

Furthermore, in the magnetostrictive torque sensor of the present invention, even a defective product having a small output in the manufacturing process can be corrected in such a manner that a high output is obtained by a once more heat treatment with the torque applied to the shaft.

Figure 3:
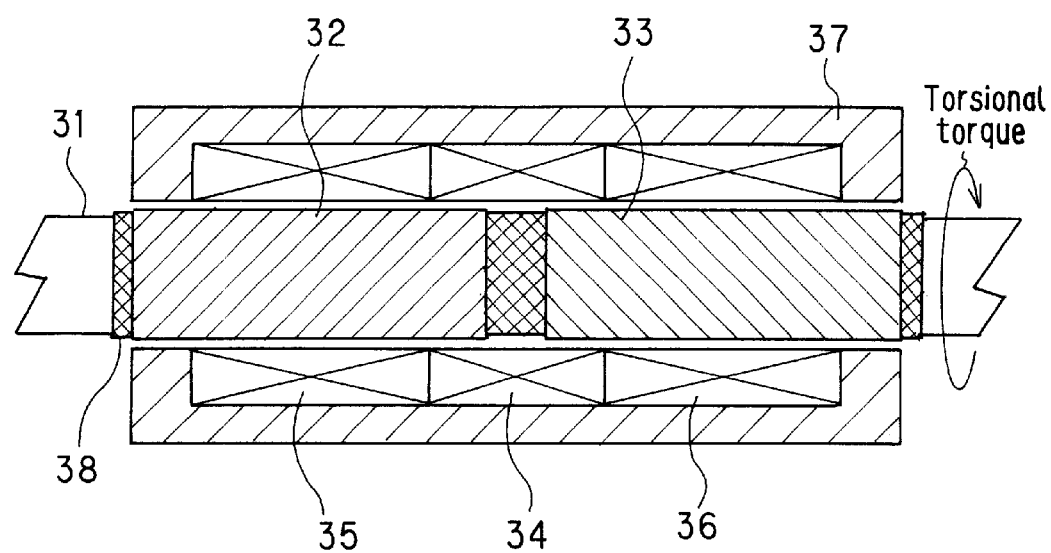
FIG. 3 is a sectional view showing a structure of a magnetostrictive stress sensor according to the present invention.

The magnetostrictive torque sensor of the present invention may be used alone, but as shown in FIG. 3, two sets of magnetostrictive torque sensors may preferably be combined and operated in a differential manner. The magnetostrictive torque sensor is constituted of a rotational shaft 31, an intermediate film 38, first magnetostrictive film 32 and second magnetostrictive film 33 formed on the surface of the intermediate film 38, an exciting coil 34, a first pickup coil 35, a second pickup coil 36, and a cylindrical yoke 37 formed of the soft magnetic material. In this case, the exciting coil 34 excites both the first and second magnetostrictive films 32 and 33, but the respective films may be excited using separate coils. Moreover, two magnetostrictive films may be replaced with one continuous film.

Figure 4A:
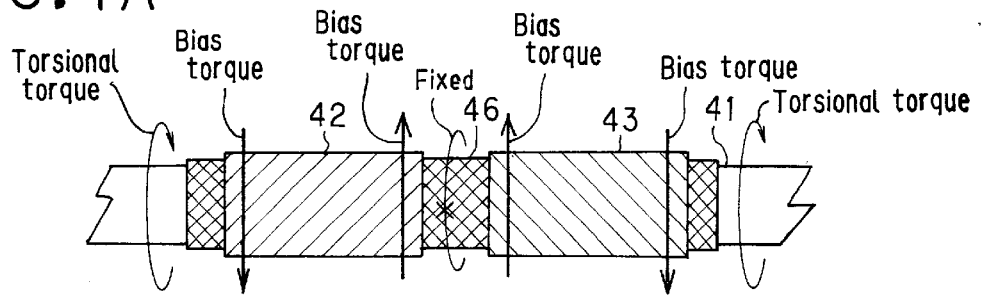
FIGS. 4A–4E show stress applied during heat treatment of the magnetostrictive stress sensor according to the present invention.

FIGS. 4A–4E show a direction of the torque applied to two magnetostrictive films during the heat treatment, and a direction of the bias torque applied to the magnetostrictive film after the heat treatment. When the magnetostrictive film having the magnetostrictive constant with the same sign is used in the two magnetostrictive constant with the same sign is used in the two magnetostrictive films, the torque may be applied as shown in FIG. 4A. That is, after forming an intermediate film 46 on a shaft, first magnetostrictive film 42, and second magnetostrictive film 43 are formed on a rotation shaft 41. A portion of the rotation shaft 41 positioned in middle is fixed, and the torsional torque is applied to opposite ends of the rotation shaft in the same direction. In this case, the torque is applied to the first and second magnetostrictive films 42 and 43 in different directions as seen from the opposite ends.

Figure 4B:
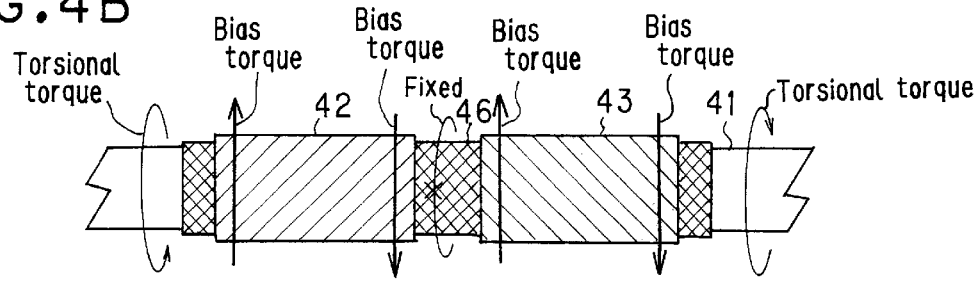
Figure 4C:
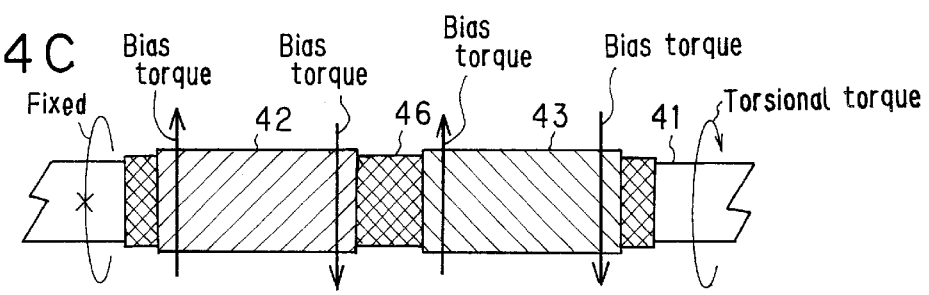

Moreover, the magnetostrictive films having the magnetostrictive constants with the different positive/negative signs can also be used in the two magnetostrictive films. For example, one is a Ni film having a negative magnetostrictive constant, and the other is a Ni—Fe alloy film having a positive magnetostrictive constant. After the two magnetostrictive films are formed, the torque is applied to the films in the same direction during the heat treatment. In this case, as shown in FIG. 4B, the middle portion of the rotation shaft 41 is fixed, and the torsional torque is applied to the opposite ends of the rotation shaft in opposite directions. Alternatively, as shown in FIG. 4C, one end of the shaft is fixed, and the torsional torque is applied to the other end of the shaft. In this case, the torque is applied to the first and second magnetostrictive films 42 and 43 in the same direction as seen from the opposite ends.

Figure 4D:
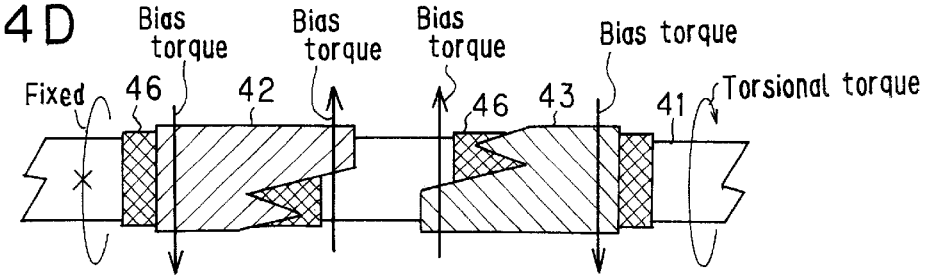

Furthermore, instead of forming the intermediate films to the all parts of the two magnetostrictive films, each of the magnetostrictive films has an inside portion, which is directly formed on the rotation shaft, as shown in FIG. 4D.

Figure 4E:
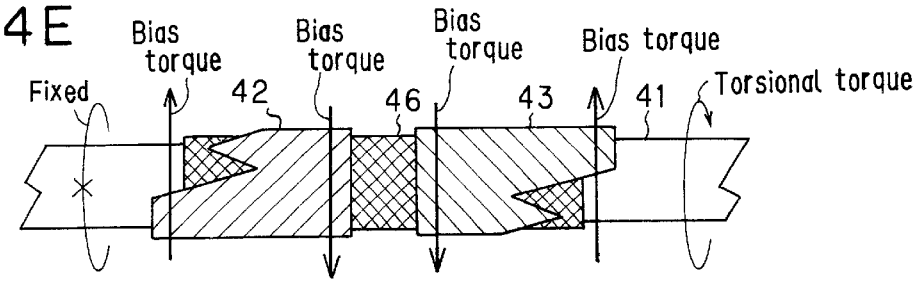

Alternatively, as shown in FIG. 4E, each of the magnetostrictive films has an outside portion, which is directly formed on the rotational shaft.

In these cases, the bias torque can effectively be applied. Even when two magnetostrictive films are formed of the films having the magnetostrictive constant with the same sign, and particularly the same composition, one end of the shaft is fixed, and the torsional torque is applied to the other end. Then, the bias torque can be applied to the two magnetostrictive films in opposite directions.

In FIGS. 4A, 4D, and 4E, the magnetostrictive films 42, 43 are separately formed, but may be formed as one magnetostrictive film. In this case, the magnetostrictive films appear to be one, but the effect similar to that of the two films can be obtained.

Figure 5:
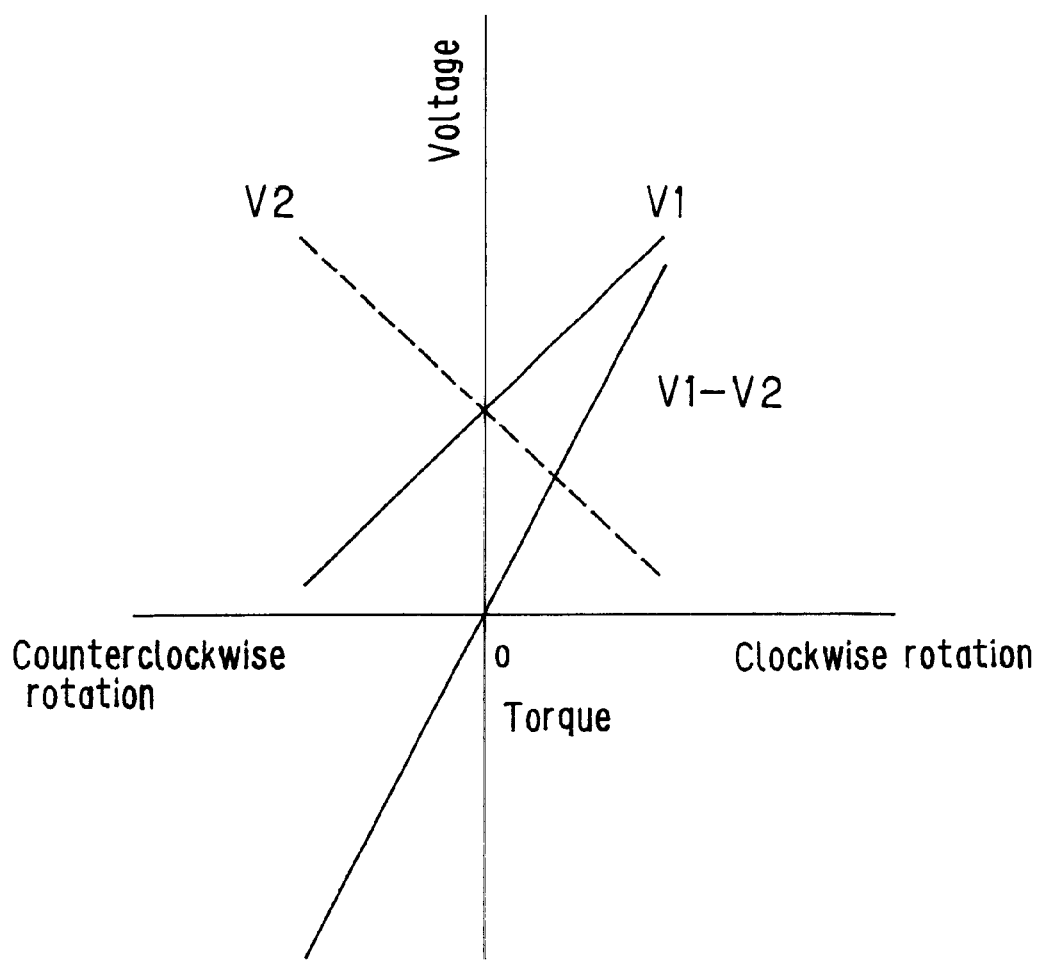
FIG. 5 is a diagram showing a stress, inductive output, and differential output of the magnetostrictive stress sensor of the present invention.

In the case of the differential operation, as shown in FIG. 5, when a difference V1–V2 between an inductive output V1 of the first pickup coil and an inductive output V2 of the second pickup coil are outputted, a torque direction and size can be detected.

The detection of the rotational torque with the torque sensor of the present invention has been described above explanation. But the present invention can be applied as a tensile sensor or another stress sensor for detecting the output corresponding to the stress as a signal. It can be use as a sensor even to measure a tensile stress or a compression stress, which is applied to the shaft, to detect longitudinal direction stress instead of the torque. That is, the torque sensor in the present invention can be applied as the stress sensor.

Moreover, in the manufacturing method of the torque sensor according to the present invention, preferably in a heat treatment step, more preferably at least in a temperature-decreasing step, the shaft is rotated. This prevents a liquefied or softened intermediate film having a low melting point from being uneven distribution between the shaft and the magnetostrictive film. A rotational speed is in a range of 0.01 to 10000 rotations/minute, preferably 1 to 100 rotations/minute. When the rotational speed is less than the range, the deviation of the intermediate film cannot sufficiently be prevented. In this case, there is a problem that a torque output fluctuates in the rotation direction of the shaft. When the rotational speed exceeds the range, the apparatus becomes expensive and is not suitable for practical use.

Furthermore, the shaft is preferably setup horizontally to a longitudinal direction of the shaft during heat treatment. Thereby, when the intermediate film having a low melting point is liquefied or softened in the longitudinal direction of the shaft, the film is prevented from being uneven distribution between the shaft and the magnetostrictive film. The torque sensor of the present invention is used by the aforementioned technique in a state in which the bias torque is applied to the magnetostrictive film with respect to the torque to be detected. Additionally, it cannot apparently be judged whether the bias torque is applied or not. However, this state can be confirmed when an output change with respect to the torque is evaluated. Furthermore, it is also possible to perform the heat treatment in a state in which the torsional torque is not applied, and to release the bias torque. The state can further securely be judged by comparison before and after this heat treatment. Additionally, the magnetostrictive film and intermediate film can be formed without any unconscious portion according to the plating process, spray coating process, sputtering process and evaporation process.

The present invention will be described hereinafter in more detail by way of concrete examples of the present invention.

EXAMPLE 1 AND COMPARATIVE EXAMPLE 1

In a usual electric plating process, a shaft of a cylindrical SCM material as a car steering shaft with a diameter of 20 mm was subjected to a pretreatment using broadly used steps (alkali defatting treatment, acid washing treatment, strike nickel plating). Thereafter, an Sn film was formed on the shaft in a thickness of 10 µm by the electric plating process. Furthermore, an Au film was formed in a thickness of 0.5 µm by the electric plating process. Subsequently, a Ni—Fe film having a positive magnetostrictive constant was formed as the magnetostrictive film in a thickness of 40 µm by the electric plating process. In an Ni—Fe alloy plating bath, a known NiFe alloy bath with of nickel sulfate, iron sulfate (II), borate, and the known plating chemicals were contained, and pH of 3 to 5, bath temperature of 20 to 70° C., and current density of 2 to 10 A/dm$^2$ were set. Additionally, the shaft was rotated in a circumferential direction at speed of 10 rotations/minute during film formation in order to enhance uniformity.

The film composition was confirmed by a fluorescent X-ray analysis apparatus and Inductively Coupled Plasma emission analysis (ICP), and a Ni content was in a range of 40 to 70 wt %. A torsional torque of 20 N·m was applied to a shaft prepared by the aforementioned steps, and the shaft was subjected to the heat treatment for ten minutes at 280° C., which is higher than the melting point of the Sn intermediate film (232° C.), and lower than the melting point of the Ni—Fe film and SCM material. The temperature was decreased to room temperature in two hours. Then, the torsional torque of 20 N·m applied to the shaft was released. For comparison, in Comparative Example 1, a shaft with no intermediate film was formed. A NiFe plated film was formed directly on the shaft of the SCM material, and no heat treatment was performed with the shaft.

Figure 6:
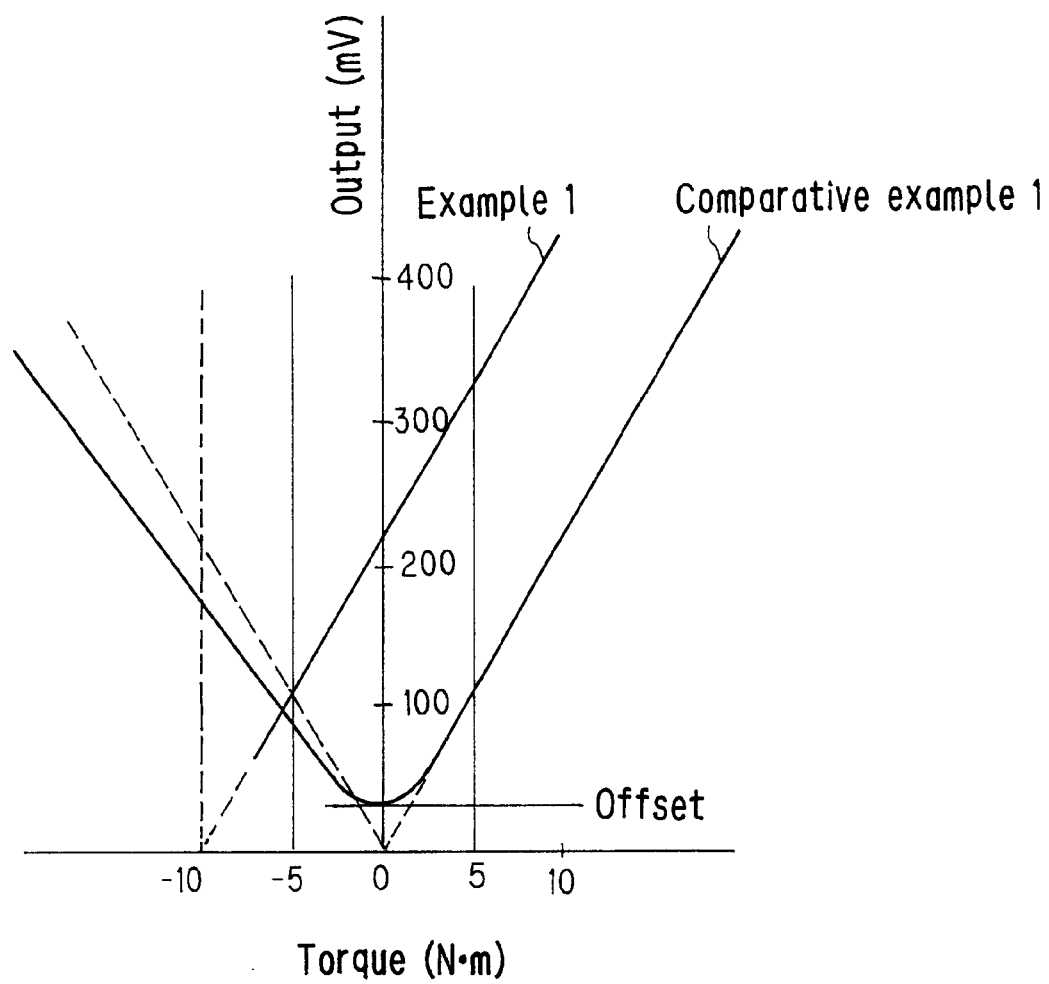
FIG. 6 is a diagram showing outputs of an example and a comparative example of the present invention.

Evaluation results of Example 1 and Comparative Example 1 are shown in FIG. 6. As shown in FIG. 6, when the left/right (clockwise/counter clockwise) torsional torque was applied, the inductive output of the pickup coil, changed. The scale and direction of the torque were detected. In Comparative Example 1 in which no intermediate film was formed, the inductive output changed with respect to the left/right torsional torque, but the torque direction was not detected, and offset existed in the vicinity of zero torque, and detection sensitivity in the vicinity of near zero torque was low.

Furthermore, a large number of sensors according to Example 1 and Comparative Example 1 were trial manufactured. The detection sensitivity of the torque sensor of Example 1, was little in dispersion compared with Comparative Example 1, and was enough in productivity as compared with Comparative Example 1. Moreover, in Comparative Example 1, defective sensors in an evaluation test were found in which the magnetostrictive film were stripped from the shaft because of an isotropic stress generated during film. However, in the torque sensor of Example 1, since the isotropic stress during film formation was released, no magnetostrictive film was stripped.

However, also in Example 1, a small number of sensors with low output were found. Therefore, the heat treatment was performed again with double torsional torque to the shaft as that of the first heat treatment, at the same temperature as that of the first heat treatment. After the second heat treatment, an output of the sensors was in a standard value range.

EXAMPLE 2 AND COMPARATIVE EXAMPLE 2

The magnetostrictive torque sensor with two sets of the magnetostrictive film and pickup coil were fabricated as similarly as Example 1. In Example 2, the shaft of the cylindrical SCM material as the car steering shaft with a diameter of 20 mm was used. The Ni—65Fe films having a positive magnetostrictive constant were electroplated as the first and second magnetostrictive films in a thickness of 20 µm, and an In intermediate film (melting point of 156° C.) was electroplated in a thickness of 10 µm. As shown in FIG. 4D, a portion of the first or second magnetostrictive film was formed directly on the shaft without any intermediate film. A 0.2 µm thick Au plated under layer film was formed the NiFe plating. As shown in FIG. 4D, one end of the shaft was fixed, a torsional torque of 30 N·m was applied, and the shaft was kept to be horizontal during heat treatment at 200° C. The heat treatment was performed by a high-frequency induction heating process for one minute, while the shaft was rotated at a ratio of 60 rotations/minute.

Water was applied to the shaft to decrease the temperature, and the shaft was quenched. It took 5 seconds for the shaft to be at the temperature of 100° C. Then the rotation of the shaft was stopped. It took more 10 seconds for the shaft to be at the temperature of 50° C. Then, the torsion torque of 30 N·m was released. Furthermore, for comparison, a NiFe plated film was directly formed on the shaft of the SCM material without forming any intermediate film and without performing any heat treatment in Comparative Example 2.

Both in Example 2 and Comparative Example 2, an alternating current was applied to the exciting coil, two magnetostrictive films were excited, and the inductive outputs of the first and second pickup coils were measured. In Example 2, as shown in FIG. 6, opposite voltage changes were observed with respect to the left/right (clockwise/counter clockwise) torsional torque and a differential operation was confirmed. The operation was confirmed for the torsional torque in a target torque detection range of −10 to +10 N·m (10 N·m in left and right). However, in Comparative Example 2 in which the intermediate film was not formed, the inductive outputs of the individual coils changed with respect to the left and right torsional torque, but the direction of the torque was not detected. This is because outputs of the left and right coils were same.

Furthermore, in an over-loaded test with a large torque of 100 N·m, no problem occurred in Example 2, but the magnetostrictive film was stripped in Comparative Example 2.

As described above, the effect of the present invention is apparent. According to the present invention, there can be provided a very superior magnetostrictive torque sensor and manufacturing method in which there is no restriction as the conventional problem on the apparatus in the step of forming the magnetostrictive film on the shaft with the torque applied thereto, a productivity defect accompanying the restriction is solved, an economical loss caused by the film unnecessarily formed on a jig or another portion is minimized, the film can be prevented from being stripped by the stress, and a error of the detecting property is minimized. Moreover, the defective product resulting from the manufacturing process is corrected, and loss can be reduced.

What is claimed is:

1. A manufacturing method of a torque sensor having a magnetostrictive film formed on a shaft whose torque is to be detected, comprising the steps of:

forming an intermediate film having a melting point lower than a melting point of said shaft between said shaft and said magnetostrictive film;

forming said magnetostrictive film having a melting point higher than the melting point of said intermediate film;

subjecting said shaft, said intermediate film and said magnetostrictive film to a heat treatment at a temperature which is not higher than the melting point of the shaft, not higher than the melting point of said magnetostrictive film and not lower than the melting point of said intermediate film in a state of subjecting said shaft to a torsional torque; and removing said torsional torque after the temperature drops.

2. The manufacturing method of the torque sensor according to claim 1, wherein the step of forming said intermediate film includes at least one of a plating process, a spray coating process, a sputtering process, and an evaporation process.

3. The manufacturing method of the torque sensor according to claim 1, wherein the step of forming said magnetostrictive film includes at least one of a plating process, a spray coating process, a sputtering process, and an evaporation process.

4. The manufacturing method of the torque sensor according to claim 1, further comprising the step of rotating said shaft at least as the temperature drops following said heat treatment.

5. A manufacturing method of a torque sensor having a magnetostrictive film formed on a shaft whose torque is to be detected, comprising the steps of:

forming an intermediate film having a melting point lower than a melting point of said shaft between a first portion of said magnetostrictive film and said shaft;

forming said magnetostrictive film having a melting point higher than the melting point of said intermediate film, a second portion of said magnetostrictive film being in contact with said shaft;

subjecting said shaft, said intermediate film and said magnetostrictive film to a heat treatment at a temperature which is not higher than the melting point of the shaft, not higher than the melting point of said magnetostrictive film and not lower than the melting point of said intermediate film in a state of subjecting said shaft to a torsional torque; and removing said torsional torque after the temperature drops.

6. The manufacturing method of the torque sensor according to claim 5, wherein the step of forming said intermediate film includes at least one of a plating process, a spray coating process, a sputtering process, and an evaporation process.

7. The manufacturing method of the torque sensor according to claim 5, wherein the step of forming said magnetostrictive film includes at least one of a plating process, a spray coating process, a sputtering process, and an evaporation process.

8. The manufacturing method of the torque sensor according to claim 5, further comprising the step of rotating said shaft at least as the temperature drops following said heat treatment.

* * * * *